(12) United States Patent
Chang et al.

(10) Patent No.: US 8,325,127 B2
(45) Date of Patent: Dec. 4, 2012

(54) SHIFT REGISTER AND ARCHITECTURE OF SAME ON A DISPLAY PANEL

(75) Inventors: Chun-Huan Chang, Hsinchu (TW);
Kuo-Chang Su, Hsinchu (TW);
Yung-Chih Chen, Hsinchu (TW);
Chun-Hsin Liu, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 337 days.

(21) Appl. No.: 12/823,237

(22) Filed: Jun. 25, 2010

(65) Prior Publication Data

US 2011/0316833 A1 Dec. 29, 2011

(51) Int. Cl.
*G06F 3/038* (2006.01)
*G11C 19/00* (2006.01)
(52) U.S. Cl. ............................ 345/100; 345/99; 345/208
(58) Field of Classification Search ............ 345/87–104, 345/204–215; 377/64, 79
See application file for complete search history.

(56) References Cited

U.S. PATENT DOCUMENTS

| 6,242,328 | B1 | 6/2001 | Shin |
| 7,342,568 | B2 * | 3/2008 | Wei et al. ....................... 345/100 |
| 8,169,395 | B2 * | 5/2012 | Jo et al. ........................... 345/99 |
| 2002/0080108 | A1 | 6/2002 | Wang |
| 2002/0163493 | A1 * | 11/2002 | Matsushima et al. ........... 345/98 |
| 2006/0267909 | A1 | 11/2006 | Hsu et al. |
| 2008/0122774 | A1 | 5/2008 | Jo et al. |
| 2008/0266275 | A1 | 10/2008 | Tsai et al. |

FOREIGN PATENT DOCUMENTS

EP 1983500 A2 10/2008

* cited by examiner

*Primary Examiner* — Hoa T Nguyen
*Assistant Examiner* — Andrew Sasinowski
(74) *Attorney, Agent, or Firm* — Morris Manning & Martin LLP; Tim Tingkang Xia, Esq.

(57) ABSTRACT

The present invention relates to a shift register and GOA architecture of the same in a display panel comprising a substrate and a plurality of pixels spatially formed on the substrate defining a number of pixel rows, each pixel row having a height of H. The shift register has the plurality of shift register stages disposed spatially and sequentially on the substrate in such a way that the layout of each shift register stage has a height of (j*H), j being an integer greater than one. Each shift register stages is configured to generate j scanning signals for driving j neighboring pixel rows, respectively.

18 Claims, 12 Drawing Sheets

SHIFT REGISTER AND ARCHITECTURE OF SAME ON A DISPLAY PANEL

FIELD OF THE INVENTION

The present disclosure relates generally to a shift register, and more particularly, to a shift register and architecture of the same on a display panel having a substrate and a plurality of pixels spatially formed on the substrate defining a number of pixel rows with a pixel height of H. The shift register has the plurality of shift register stages disposed spatially and sequentially on the substrate in such a way that the layout of each shift register stage has a height of (j*H), j being an integer greater than one. Each shift register stages is configured to generate j scanning signals for driving j neighboring pixel rows, respectively.

BACKGROUND OF THE INVENTION

A display panel has a substrate and pixel elements formed thereon. These pixel elements are substantially arranged in the form of a matrix having gate lines in rows and data lines in columns. The display panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for displaying an image on the panel.

In such a driving circuit, a shift register having multiple stages is utilized in the gate driver to generate the plurality of gate signals for sequentially driving the gate lines. To lower down costs, there have been efforts to integrate the shift register and the gate driver into a display panel. One of the efforts, for example, is to fabricate the shift register and the gate driver on a glass substrate of the panel, namely, the gate driver on array (GOA) arrangement, using amorphous silicon (a-Si) thin film transistors (TFTs), and/or low temperature polycrystalline silicon (LTPS) TFTs.

FIG. 12 shows a display panel 10 with a conventional GOA architecture 11 of a shift register formed thereon. The shift register has a plurality of stages 16. Each stage 16 generates a scanning signal for driving a corresponding pixel row of the display panel. For the GOA architecture 11, each stage 16 is formed on a substrate having a layout 13 with a height of H, which is the same as the height of a pixel row 12 of the display panel 10. As the high resolution is very demanded for high quality of image display, the shift register is usually designed to a great number of stages. Additionally, the circuit of each stage becomes more complicated as the display technology advances. This makes the GOA design of a display panel very complicated.

Therefore, a heretofore unaddressed need exists in the art to address the aforementioned deficiencies and inadequacies.

SUMMARY OF THE INVENTION

In one aspect, the present invention relates to a shift register. In one embodiment, the shift register includes a plurality of shift register stages, $\{S_n\}$, n=1, 2, ..., N, N being a positive integer, electrically coupled to each other in series.

Each stage $S_n$ includes a stage shift circuit having a first input for receiving a first control signal, HC1, and an output for outputting an output signal responsively, and a de-multiplexing circuit comprising a first switch circuit and a second switch circuit, wherein the first switch circuit has a first input for receiving a first clock signal CK1, a second input electrically coupled to the output of the stage shift circuit, and an output for outputting a first scanning signal, G(2n-1), responsively, and wherein the second switch circuit has a first input for receiving a second clock signal CK2, a second input electrically coupled to the output of the stage shift circuit, and an output for outputting a second scanning signal, G(2n), responsively.

Each of the first control signal HC1, the first clock signal CK1 and the second clock signal CK2 is characterized with a waveform alternating between a high voltage level and a low voltage level, wherein the high voltage levels of the first control signal HC1, the first clock signal CK1 and the second clock signal CK2 have widths, $W_H$, $W_1$ and $W_2$, respectively, satisfying the following relationship of:

$$W_H \geq W_1 + W_2.$$

Each of the first and second switch circuits has a first transistor having a gate, a source and a drain electrically coupled to the second input, the first input and the output of the switch circuit, respectively. In one embodiment, each of the first and second switch circuits further has a second transistor having a gate electrically coupled to the drain of the first transistor, a source electrically couple to the gate, and a drain electrically coupled to the source of the first transistor. In another embodiment, each of the first and second switch circuits also has a pull down circuit electrically coupled to the drain of the first transistor.

In one embodiment, each of the first and second switch circuits comprises a first transistor having a gate, a source and a drain electrically coupled to the first input, the second input and the output of the switch circuit, respectively, and a diode having an anode and a cathode electrically coupled to the drain and the gate of the first transistor, respectively.

In another embodiment, each of the first and second switch circuits comprises a diode having an anode electrically coupled to the first input of the switch circuit and a cathode, a first transistor having a gate, a source and a drain electrically coupled to the second input of the switch circuit, the cathode of the diode and the output of the switch circuit, respectively, and a second transistor having a gate electrically coupled to the drain of the first transistor, a source electrically couple to the gate, and a drain electrically coupled to the anode of the diode.

In yet another embodiment, each of the first and second switch circuits comprises a diode having an anode electrically coupled to the first input of the switch circuit and a cathode, a first transistor having a gate, a source and a drain electrically coupled to the second input of the switch circuit, the cathode of the diode and the output of the switch circuit, respectively, and a pull down circuit electrically coupled to the drain of the first transistor.

The stage shift circuit in one embodiment, further has a second input for receiving a second control signal, LC1, a third input for receiving a third control signal, LC2, a fourth input for receiving a reference voltage VSS, a fifth input for receiving the second scanning signal G(2n-2) output from the immediate prior stage, $S_{n-1}$, and a sixth input for receiving the second scanning signal G(2n+2) output from the immediate next stage, $S_{n+1}$.

In one embodiment, the stage shift circuit includes a pull-up control circuit electrically coupled to the fifth input, a pull-up circuit electrically coupled to the pull-up control circuit, the first input and the output, a pull-down control circuit electrically coupled to the pull-up control circuit, the pull-up circuit, and the second, third and fourth inputs, and a pull-down circuit electrically coupled to the pull-down control circuit, the pull-up circuit, the sixth input and the output.

In another aspect, the present invention relates to a gate driver-on-array (GOA) architecture of the shift register disclosed above in a display panel comprising a substrate and a plurality of pixels spatially formed on the substrate defining a number of pixel rows, each pixel row having a height of H. In one embodiment the plurality of shift register stages $\{S_n\}$ is disposed spatially and sequentially on the substrate such that each shift register stage $S_n$ has a layout with a height of 2H, and the first and second scanning signals G(2n−1) and G(2n) output from the shift register stage $S_n$ are used to drive the (2n−1)-th pixel row and the (2n)-th pixel row, respectively.

The GOA architecture further includes a formation of a data bus on the substrate for providing at least the first control signal HC1, and the first and second clock signal CK1 and CK2.

In yet another aspect, the present invention relates to a shift register comprising a plurality of shift register stages, $\{S_n\}$, n=1, 2, ..., N, N being a positive integer, electrically coupled to each other in series.

Each stage $S_n$ includes a stage shift circuit having a first input for receiving a first control signal, HC1, and an output for outputting an output signal responsively, and a de-multiplexing circuit for receiving the output signal from the stage shift circuit and j clock signals, CK1, CK2, ... and CKj from a data bus and responsively outputting j scanning signals, G(j*n−j+1), G(j*n−j+2), ... and G(j*n), comprising j switch circuits, j being an integer greater than one, wherein each switch circuit has a first input for receiving a corresponding one of the j clock signals, CK1, CK2, ... and CKj, a second input electrically coupled to the output of the stage shift circuit for receiving the output signal therefrom, and an output for outputting a corresponding one of the j scanning signals, G(j*n−j+1), G(j*n−j+2), ... and G(j*n).

Each of the first control signal HC1, and the j clock signals, CK1, CK2, ... and CKj is characterized with a waveform alternating between a high voltage level and a low voltage level, wherein the high voltage levels of the first control signal HC1, and the j clock signals, CK1, CK2, ... and CKj have widths, $W_H$, $W_1$, $W_2$, ... and $W_j$, respectively, satisfying the following relationship of:

$$W_H \geq W_1 + W_2 + \ldots + W_j.$$

Each of the j switch circuits has a first transistor having a gate, a source and a drain electrically coupled to the second input, the first input and the output of the switch circuit, respectively. In one embodiment, each of the j switch circuits further has a second transistor having a gate electrically coupled to the drain of the first transistor, a source electrically couple to the gate, and a drain electrically coupled to the source of the first transistor. In another embodiment, each of the j switch circuits also has a pull down circuit electrically coupled to the drain of the first transistor.

In one embodiment, each of the j switch circuits comprises a first transistor having a gate, a source and a drain electrically coupled to the first input, the second input and the output of the switch circuit, respectively, and a diode having an anode and a cathode electrically coupled to the drain and the gate of the first transistor, respectively.

In another embodiment, each of the j switch circuits comprises a diode having an anode electrically coupled to the first input of the switch circuit and a cathode, a first transistor having a gate, a source and a drain electrically coupled to the second input of the switch circuit, the cathode of the diode and the output of the switch circuit, respectively, and a second transistor having a gate electrically coupled to the drain of the first transistor, a source electrically couple to the gate, and a drain electrically coupled to the anode of the diode.

In yet another embodiment, each of the j switch circuits comprises a diode having an anode electrically coupled to the first input of the switch circuit and a cathode, a first transistor having a gate, a source and a drain electrically coupled to the second input of the switch circuit, the cathode of the diode and the output of the switch circuit, respectively, and a pull down circuit electrically coupled to the drain of the first transistor.

In a further aspect, the present invention relates a GOA architecture of the shift register disclosed above in a display panel comprising a substrate and a plurality of pixels spatially formed on the substrate defining a number of pixel rows, each pixel row having a height of H. In one embodiment, the plurality of shift register stages $\{S_n\}$ is disposed spatially and sequentially on the substrate such that each shift register stage $S_n$ has a layout with a height of (j*H), and the j scanning signals G(j*n−j+1), G(j*n−j+2), ... and G(j*n) output from the shift register stage $S_n$, are used to drive the (j*n−j+1)-th pixel row, (j*n−j+2)-th pixel row, ... and the (j*n)-th pixel row, respectively.

The GOA architecture also includes a formation of the data bus on the substrate for providing at least the first control signal HC1, and the j clock signals CK1, CK2, ... and CKj.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
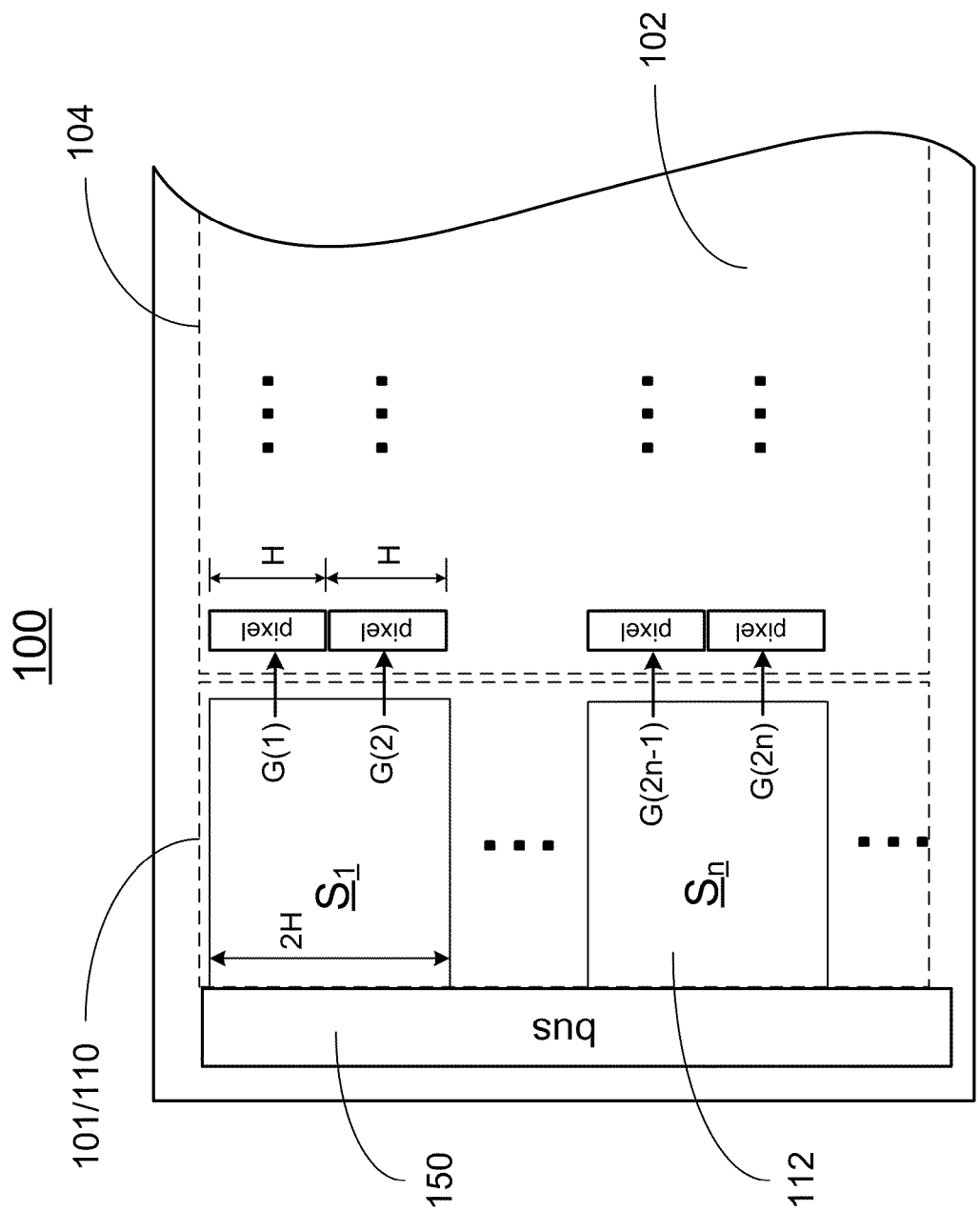
FIG. 1 shows schematically a display panel with a GOA architecture of a shift register formed thereon according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "gate driver on array" or its acronym "GOA" refers to a fabricating layout or architecture of a shift register and/or a gate driver on a glass substrate of a display panel, with amorphous silicon (a-Si) thin film transistors (TFTs), and/or low temperature polycrystalline silicon (LTPS) TFTs.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-11. In accordance with the purposes of this disclosure, as embodied and broadly described herein, this disclosure, in one aspect, relates to a shift register and GOA architecture of the same in a display panel.

Referring to FIG. 1, a display panel 100 with a GOA architecture 101 of a shift register 110 formed thereon is schematically shown according to one embodiment of the present invention. The display panel 100 includes a substrate 102 and a plurality of pixels 104 spatially formed on the substrate 102 defining a number of pixel rows. Each pixel row has a height of H.

The shift register 110 includes a plurality of shift register stages, $\{S_n\}$, n=1, 2, ..., N, N being a positive integer, electrically coupled to each other in series. Each shift register stage $S_n$ is configured to receive one or more control and clock signals and to output responsively a first scanning signal G(2n−1) and a second scanning signal G(2n) for driving the (2n−1)-th pixel row and the (2n)-th pixel row, respectively. In this exemplary embodiment, the plurality of shift register stages $\{S_n\}$ is disposed spatially and sequentially on the substrate 102 in such a way that each shift register stage $S_n$ has a layout 112 with a height of 2H. The first and second scanning signals G(2n−1) and G(2n) output from the shift register stage $S_n$ are used to drive the (2n−1)-th pixel row and the (2n)-th pixel row, respectively.

The GOA architecture 101 also includes a formation of a data bus 150 on the substrate 102 for providing, for example, the control and clock signals for each the shift register stage $S_n$.

Figure 2:
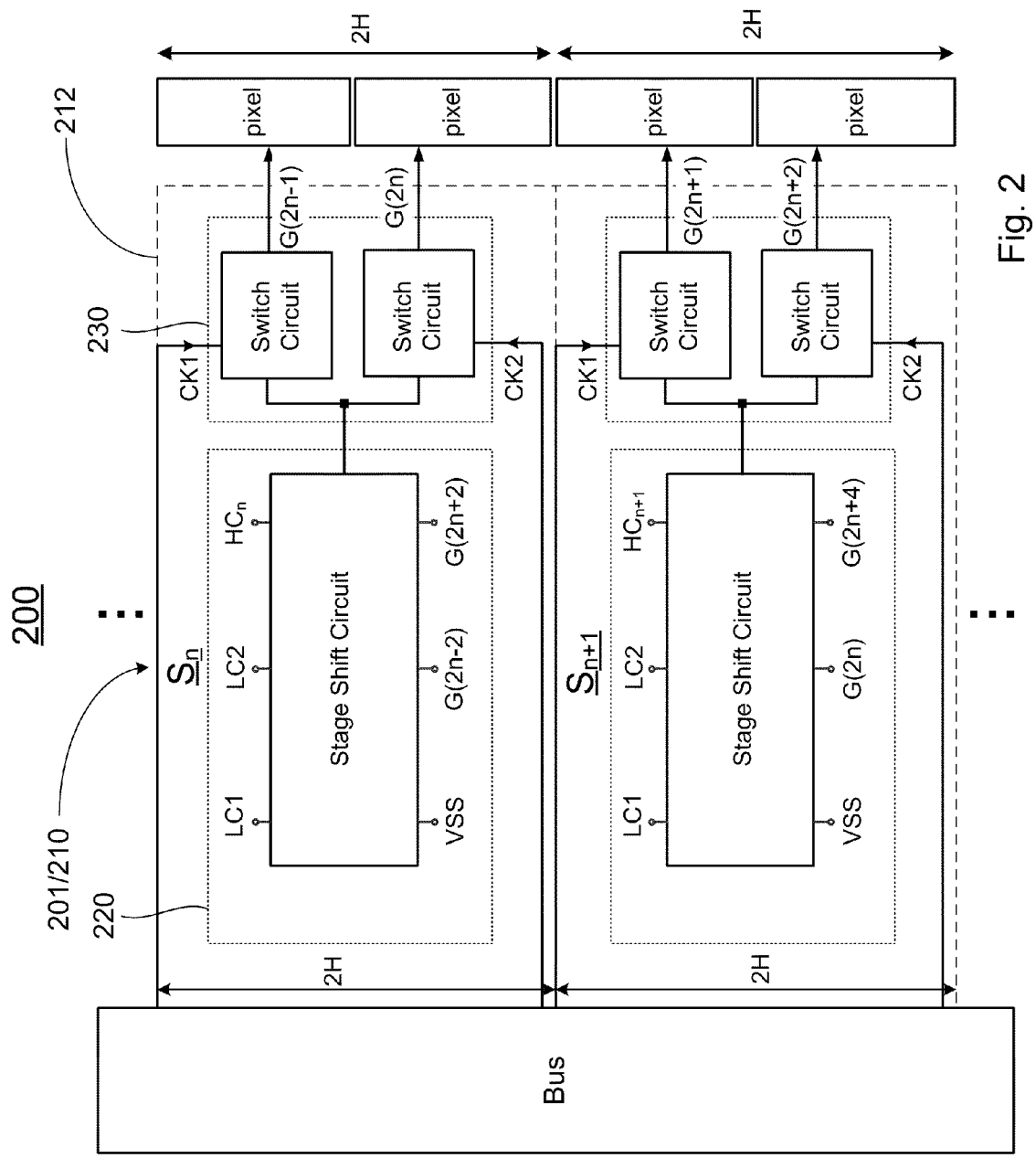
FIG. 2 shows schematically a display panel with a GOA architecture of a shift register formed thereon according to another embodiment of the present invention.

Referring now to FIG. 2, a display panel 200 with a GOA architecture 201 of a shift register 210 formed thereon is schematically shown according to another embodiment of the present invention. The shift register 210 includes a plurality of shift register stages, $\{S_n\}$, n=1, 2, ..., N, disposed spatially and sequentially on the substrate 202 in such a way that each shift register stage $S_n$ has a layout 212 with a height of 2H.

Each stage $S_n$ includes a stage shift circuit 220 and a de-multiplexing circuit 230 electrically coupled to the stage shift circuit 220 for outputting a first scanning signal G(2n−1) and a second scanning signal G(2n), which are used to drive the (2n−1)-th pixel row and the (2n)-th pixel row, respectively.

In this exemplary embodiment shown in FIG. 2, the stage shift circuit 220 has a first input for receiving a first control signal, $HC_n$, a second input for receiving a second control signal, LC1, a third input for receiving a third control signal, LC2, a fourth input for receiving a reference voltage VSS, a fifth input, a sixth input, and an output for responsively outputting an output signal. Further, the fifth input is adapted for receiving the second scanning signal G(2n−2) output from the immediate prior stage, $S_{n−1}$, while the sixth input is adapted for receiving the second scanning signal G(2n+2) output from the immediate next stage, $S_{n+1}$. For such an arrangement, the plurality of shift register stages $\{S_n\}$ is electrically coupled to each other in series.

According to the present invention, any types of stage shift circuits can be utilized to practice the invention. Generally, the stage shift circuit 220 includes a pull-up control circuit electrically coupled to the fifth input, a pull-up circuit electrically coupled to the pull-up control circuit, the first input and the output, a pull-down control circuit electrically coupled to the pull-up control circuit, the pull-up circuit, and the second, third and fourth inputs, and a pull-down circuit electrically coupled to the pull-down control circuit, the pull-up circuit, the sixth input and the output.

The de-multiplexing circuit 230 includes a first switch circuit and a second switch circuit. The first switch circuit has a first input for receiving a first clock signal CK1, a second input electrically coupled to the output of the stage shift circuit 220, and an output for outputting the first scanning signal G(2n−1), responsively. The second switch circuit has a first input for receiving a second clock signal CK2, a second input electrically coupled to the output of the stage shift circuit 220, and an output for outputting the second scanning signal G(2n), responsively.

In practice, the first control signal $HC_n$ is a low frequency AC signal, while both the first and second clock signals LC1 and LC2 are two high frequency AC signals. Further, the first and second clock signals LC1 and LC2 are out-of phase from one another. Each of the first control signal HC1, the first clock signal CK1 and the second clock signal CK2 is characterized with a waveform alternating between a high voltage level and a low voltage level. The high voltage levels of the first control signal $HC_n$, the first clock signal CK1 and the second clock signal CK2 have widths, $W_H$, $W_1$ and $W_2$, respectively, which satisfy the following relationship of:

$$W_H \geq W_1 + W_2.$$

FIGS. 3-8 show schematically various embodiments of a display panel with a GOA architecture of a shift register formed thereon. All the embodiments of the display panel have the same GOA architecture of the shift register as that of the display panel 200 shown in FIG. 2, where the layout of each shift register stage $S_n$ on the substrate has a height of 2H, and each shift register stage $S_n$ operably generates a first scanning signal G(2n−1) and a second scanning signal G(2n) for driving the (2n−1)-th pixel row and the (2n)-th pixel row of the display panel, respectively. For such a GOA architecture, the circuit layout of the shift register on the substrate is substantially simplified.

As shown in FIGS. 3-8, however, in these exemplary embodiments, the de-multiplexing circuit having the first and second switch circuits has different configurations.

Figure 3:
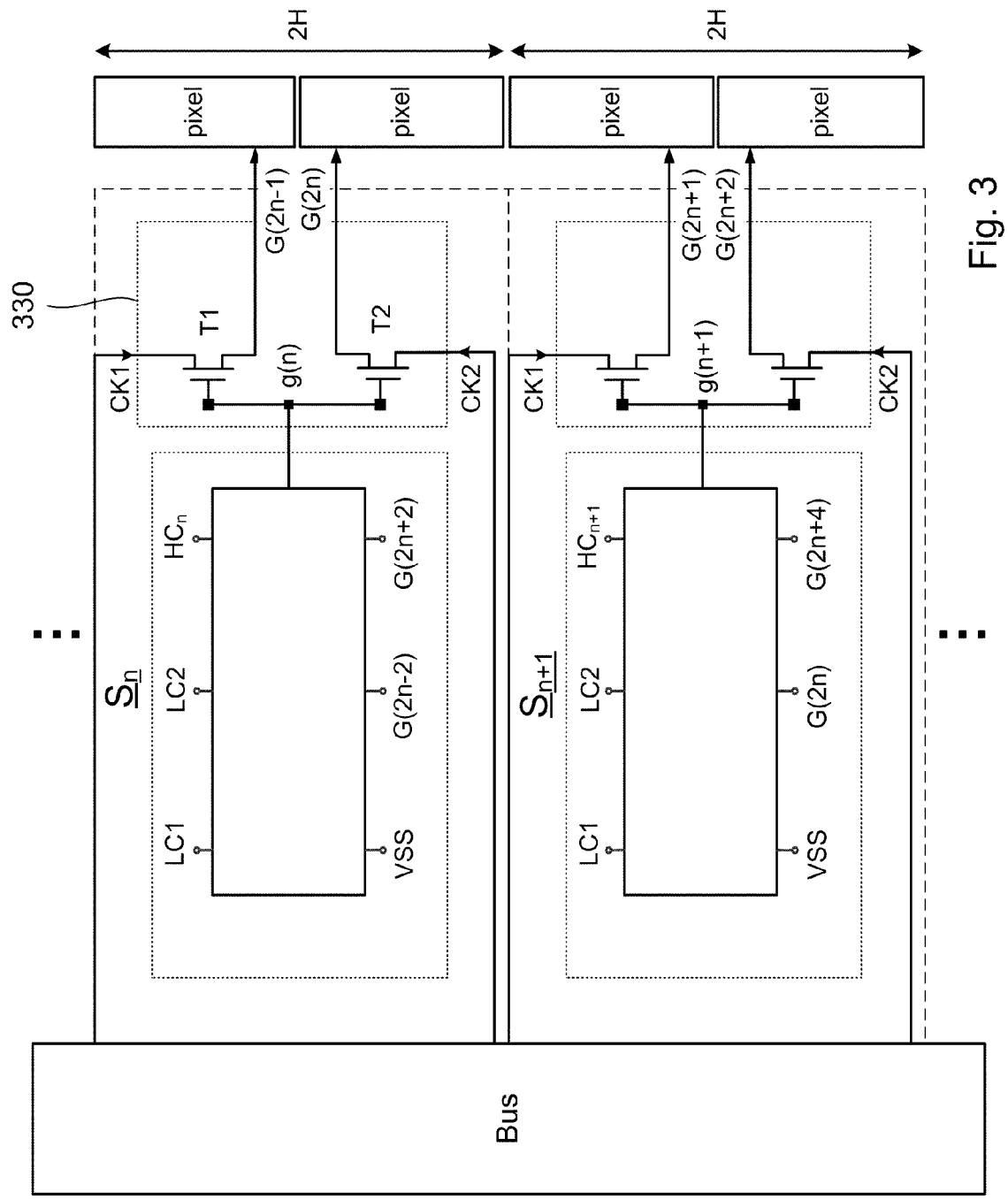
FIG. 3 shows schematically a display panel with a GOA architecture of a shift register formed thereon according to yet another embodiment of the present invention.

For example, as shown in FIG. 3, each of the first and second switch circuits of the de-multiplexing circuit 330 has a transistor T1 or T2 having a gate electrically coupled to the second input of the switch circuit for receiving the output signal of the stage shift circuit, a source coupled to the first input of the switch circuit for receiving the first clock signal CK1 or the second clock signal CK2, and a drain electrically coupled to the output of the switch circuit for outputting a corresponding scanning signal G(2n−1) or G(2n), respectively.

Figure 4:
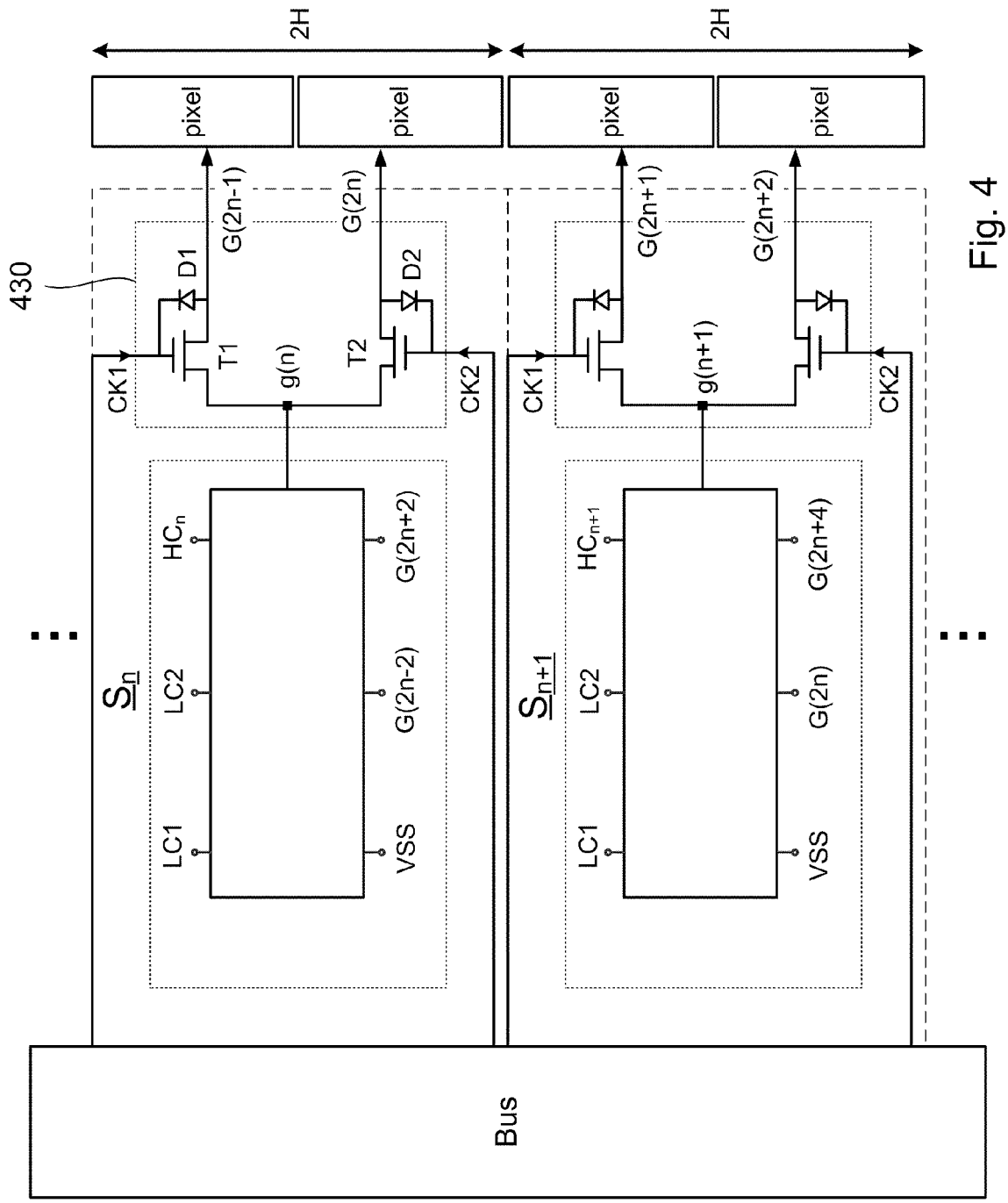
FIG. 4 shows schematically a display panel with a GOA architecture of a shift register formed thereon according to a further embodiment of the present invention.

As shown in FIG. 4, each of the first and second switch circuits of the de-multiplexing circuit 430 has a transistor T1 or T2 and a diode D1 or D2. The transistor T1 or T2 has a gate electrically coupled to the first input of the switch circuit for receiving the first clock signal CK1 or the second clock signal CK2, a source coupled to the second input of the switch circuit for receiving the output signal of the stage shift circuit and a drain electrically coupled to the output of the switch circuit for outputting a corresponding scanning signal G(2n−1) or G(2n), respectively. The diode D1 or D2 has an anode and a cathode electrically coupled to the drain and the gate of the transistor T1 or T2, respectively.

Figure 5:
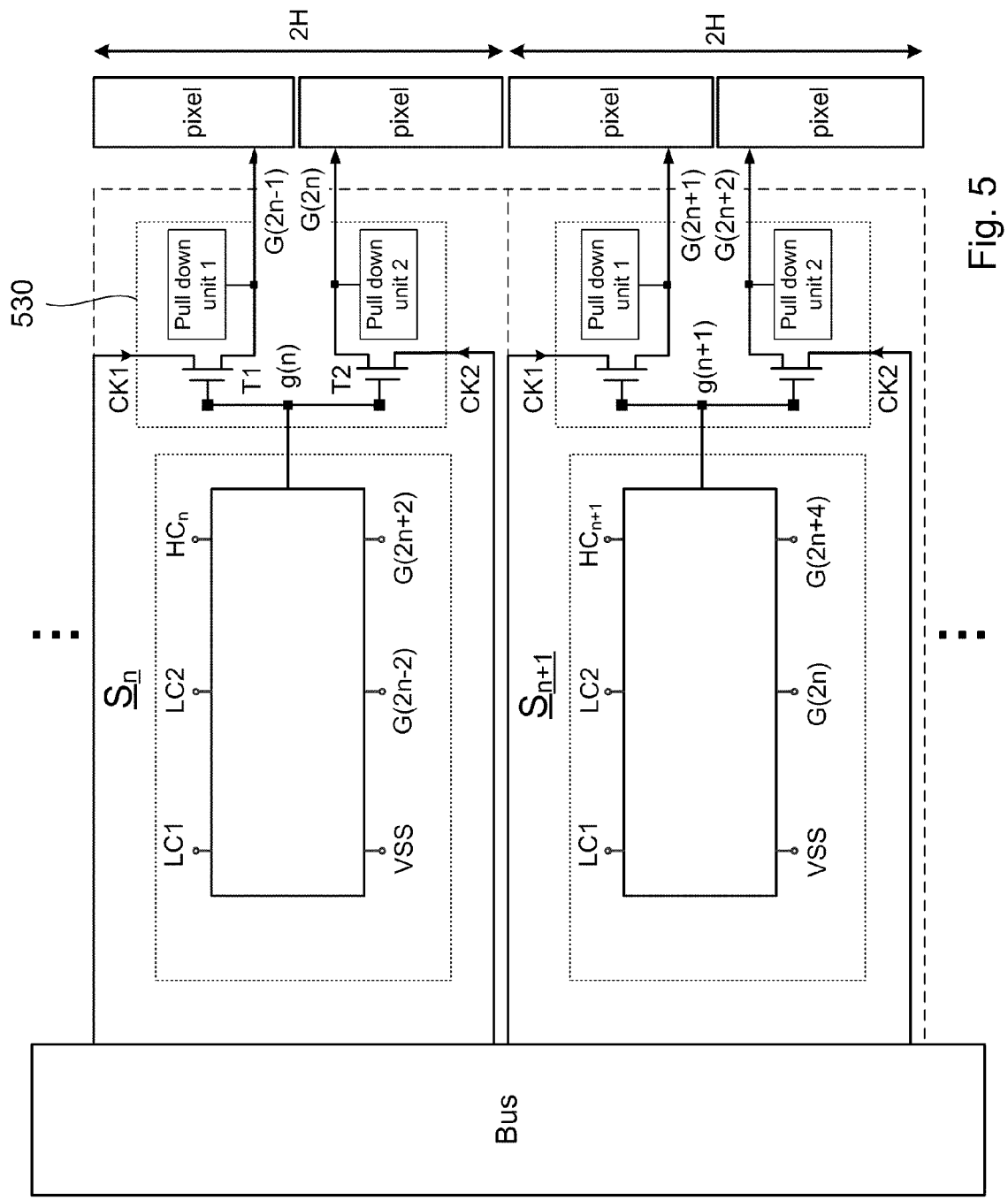
FIG. 5 shows schematically a display panel with a GOA architecture of a shift register formed thereon according to yet a further embodiment of the present invention.

Referring to FIG. 5, each of the first and second switch circuits of the de-multiplexing circuit 530 has a transistor T1 or T2 and a pull-down unit 1 or a pull-down unit 2. The transistor T1 or T2 has a gate electrically coupled to the second input of the switch circuit for receiving the output signal of the stage shift circuit, a source coupled to the first input of the switch circuit for receiving the first clock signal CK1 or the second clock signal CK2, and a drain electrically coupled to the output of the switch circuit for outputting a corresponding scanning signal G(2n−1) or G(2n), respectively. The pull-down unit 1 or the pull-down unit 2 is electrically coupled to the drain of the transistor T1 or T2, respectively.

Figure 6:
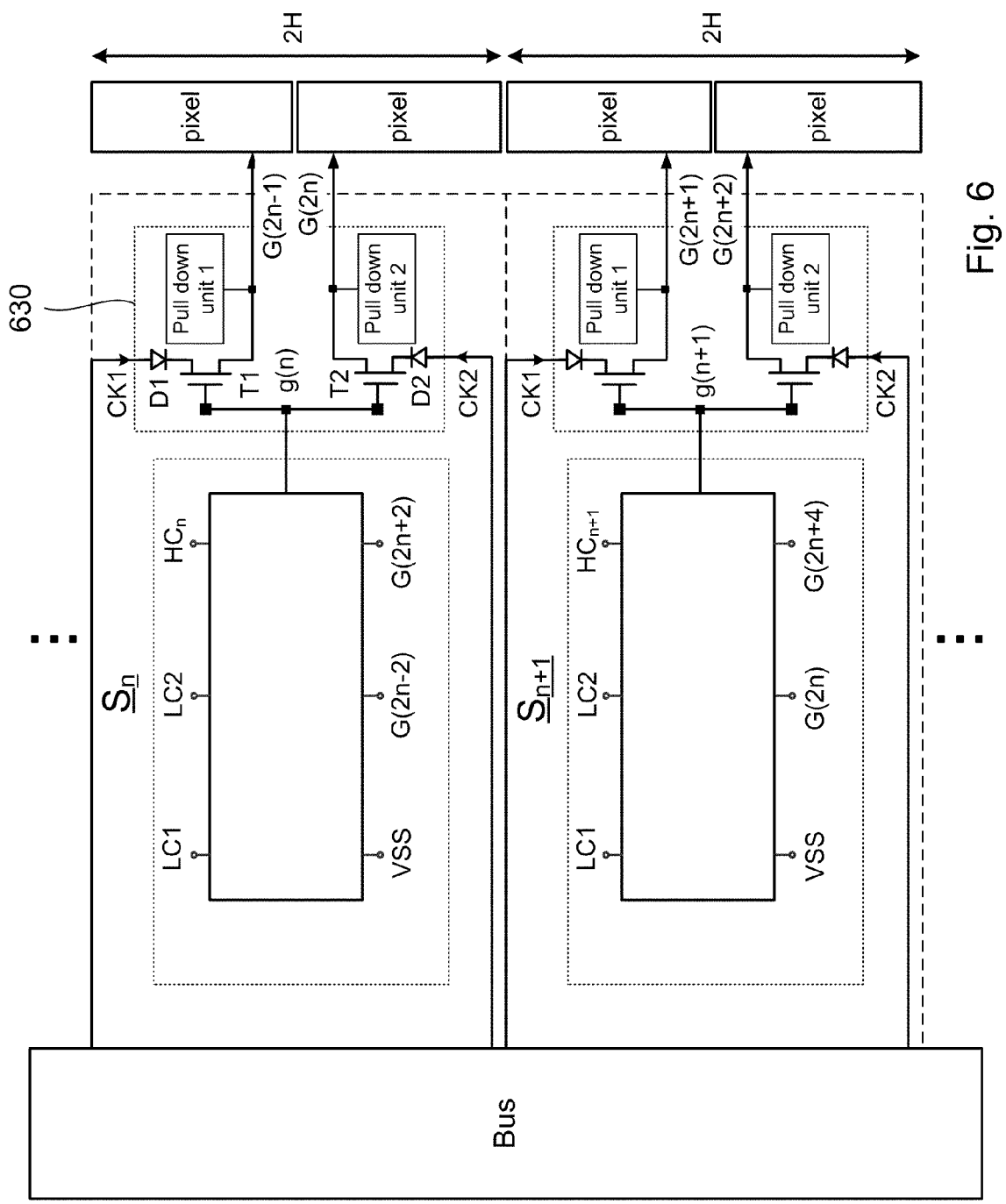
FIG. 6 shows schematically a display panel with a GOA architecture of a shift register formed thereon according to an alternative embodiment of the present invention.

Referring to FIG. 6, each of the first and second switch circuits of the de-multiplexing circuit 630 is similar to that shown in FIG. 5, except that each of the first and second switch circuits includes an additional diode D1 or D2. The diode D1 or D2 has an anode connected to the first input of the switch circuit for receiving the first clock signal CK1 or the second clock signal CK2, and a cathode connected to the source of the transistor T1 or T2.

Figure 7:
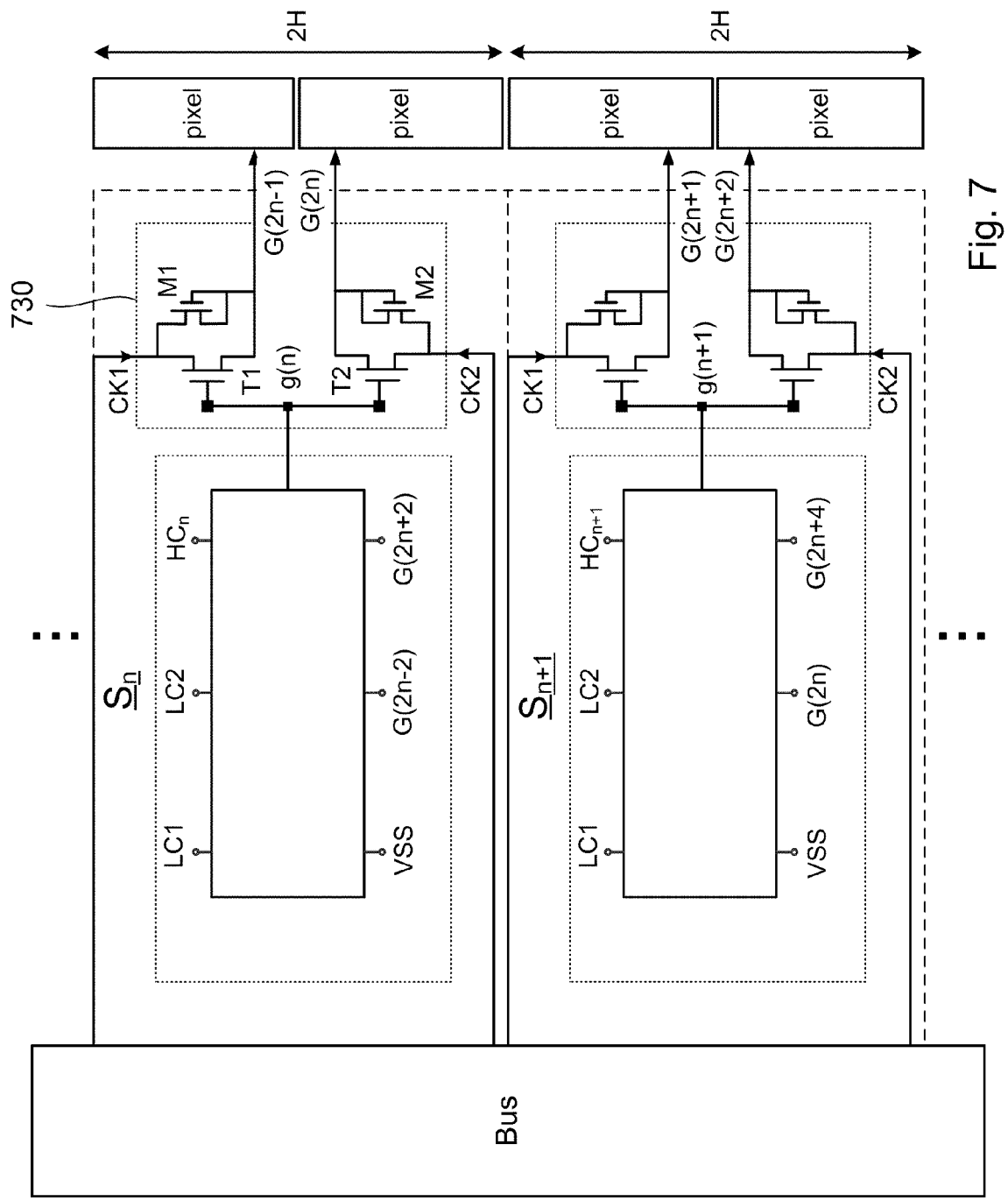
FIG. 7 shows schematically a display panel with a GOA architecture of a shift register formed thereon according to yet an alternative embodiment of the present invention.

Referring to FIG. 7, each of the first and second switch circuits of the de-multiplexing circuit 730 has a first transistor T1 or T2 and a second transistor M1 or M2. The transistor T1 or T2 has a gate electrically coupled to the second input of the switch circuit for receiving the output signal of the stage shift circuit, a source coupled to the first input of the switch circuit for receiving the first clock signal CK1 or the second clock signal CK2, and a drain electrically coupled to the output of the switch circuit for outputting a corresponding scanning signal G(2n−1) or G(2n), respectively. The second transistor M1 or M2 has a gate electrically coupled to the drain of the first transistor T1 or T2, a source electrically couple to the gate, and a drain electrically coupled to the source of the first transistor T1 or T2.

Figure 8:
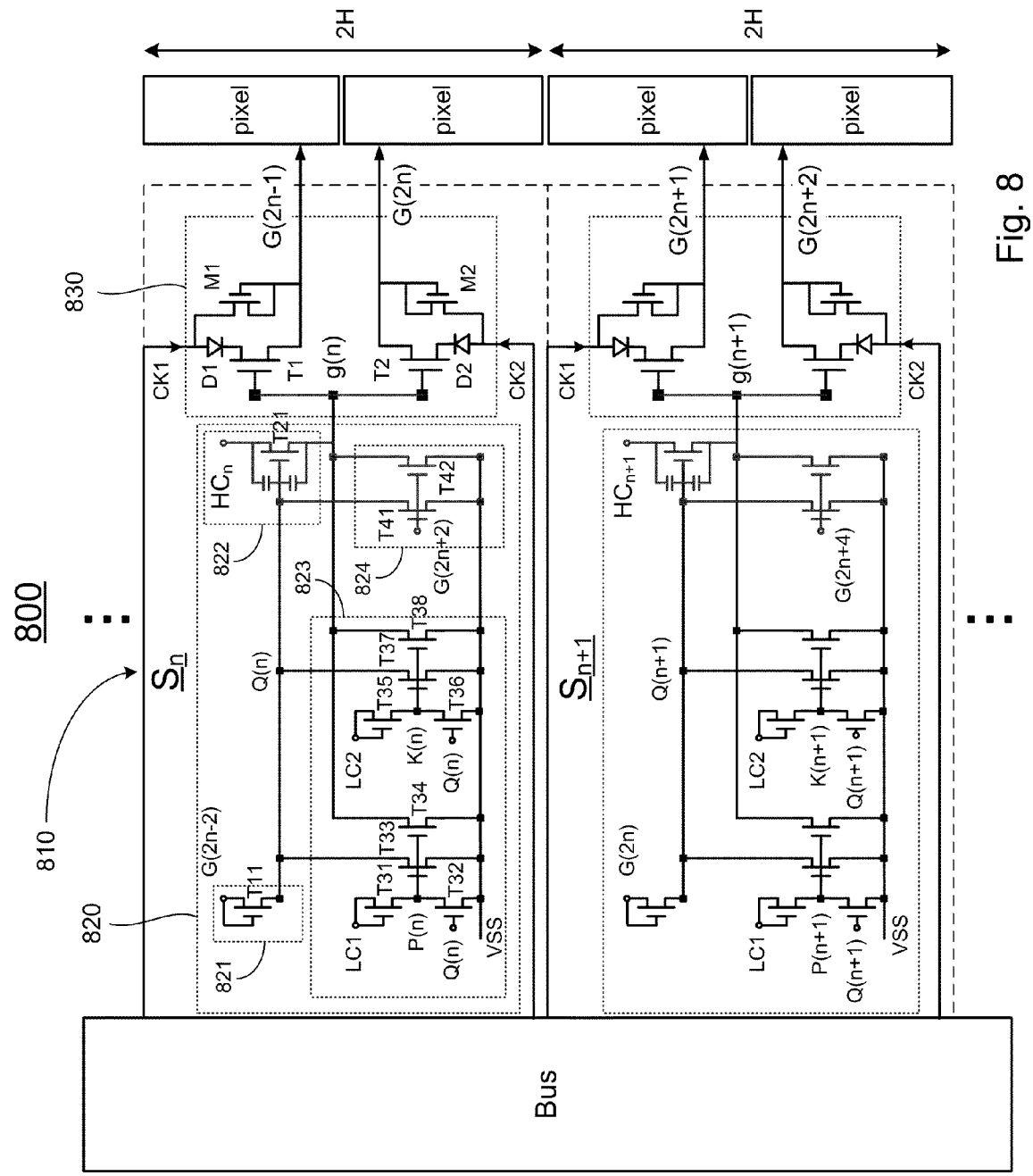
FIG. 8 shows schematically a display panel with a GOA architecture of a shift register formed thereon according to one embodiment of the present invention.

As shown in FIG. 8, each of the first and second switch circuits of the de-multiplexing circuit 830 is similar to that shown in FIG. 7, except that each of the first and second switch circuits includes an additional diode D1 or D2. The diode D1 or D2 has an anode connected to the first input of the switch circuit for receiving the first clock signal CK1 or the second clock signal CK2, and a cathode connected to the source of the transistor T1 or T2.

In addition, FIG. 8 also shows an exemplary embodiment of the stage shift circuit 820 of the shift register 810. The stage shift circuit 820 includes a pull-up control circuit 821 electrically coupled to the fifth input for receiving the scanning signal G(2n−2) outputting from the immediately prior shift register stage $S_{n-1}$, a pull-up circuit 822 electrically coupled to the pull-up control circuit 821, the first input for receiving the first control signal HC1, and the output for outputting a signal g(n), a pull-down control circuit 823 electrically coupled to the pull-up control circuit 821, the pull-up circuit 822, and the second, third and fourth inputs for receiving the second control signal LC1, the third control signal LC2 and the reference voltage VSS, respectively, and a pull-down circuit 824 electrically coupled to the pull-down control circuit 823, the pull-up circuit 822, the sixth input for receiving the scanning signal G(2n+2) outputting from the immediately next shift register stage $S_{n+1}$ and the output for outputting the signal g(n).

Specifically, the pull-up control circuit 821 includes a transistor T11 having a gate electrically coupled to the fifth input of the stage shift circuit 820 for receiving the scanning signal G(2n−2) outputting from the immediately prior shift register stage $S_{n-1}$, a source electrically coupled to the gate and a drain electrically coupled to a node Q(n).

The pull-up circuit 822 includes a transistor T21 having a gate electrically coupled to the node Q(n), a source electrically coupled to the first input of the stage shift circuit 820 for receiving the first control signal HC1, and a drain electrically coupled to the output g(n) of the stage shift circuit 820.

The pull-down control circuit 823 includes a first pull-down control circuit and a second pull-down control circuit. Each pull-down control circuit has four transistors, for example, T31, T32, T33 and T34 for the first pull-down control circuit, and T35, T36 T37 and T38 for the second pull-down control circuit. For the first pull-down control circuit, the transistor T31 has a gate electrically coupled to the second input of the stage shift circuit 820 for receiving the second control signal LC1, a source electrically coupled to the gate, and a drain electrically coupled to a node P(n); the transistor T32 has a gate electrically coupled to the node Q(n), a source electrically coupled to the node P(n), and a drain electrically coupled to the fourth input of the stage shift circuit 820 for receiving the reference voltage VSS; the transistor T33 has a gate electrically coupled to the node P(n), a source electrically coupled to the node Q(n), and a drain electrically coupled to the drain of the transistor T32; and the transistor T34 has a gate electrically coupled to the node P(n), a source electrically coupled to the output g(n) of the stage shift circuit 820, and a drain electrically coupled to the drain of the transistor T32. For the second pull-down control circuit, the transistor T35 has a gate electrically coupled to the third input of the stage shift circuit 820 for receiving the third control signal LC2, a source electrically coupled to the gate, and a drain electrically coupled to a node K(n); the transistor T36 has a gate electrically coupled to the node Q(n), a source electrically coupled to the node K(n), and a drain electrically coupled to the fourth input of the stage shift circuit 820 for receiving the reference voltage VSS; the transistor T37 has a gate electrically coupled to the node K(n), a source electrically coupled to the node Q(n), and a drain electrically coupled to the drain of the transistor T36; and the transistor T38 has a gate electrically coupled to the node K(n), a source electrically coupled to the output g(n) of the stage shift circuit 820, and a drain electrically coupled to the drain of the transistor T36.

The pull-down circuit 824 has a first transistor T41 and a second transistor T42. The first transistor T41 has a gate electrically coupled to the sixth input for receiving the scanning signal G(2n+2) outputting from the immediately next shift register stage $S_{n+1}$, a source electrically coupled to the node Q(n), and a drain electrically coupled to the drain of the transistor T38. The second transistor T42 has a gate electrically coupled to the gate of the first transistor T41, a source electrically coupled to the output g(n) of the stage shift circuit 820, and a drain electrically coupled to the drain of the transistor T42.

Figure 9:
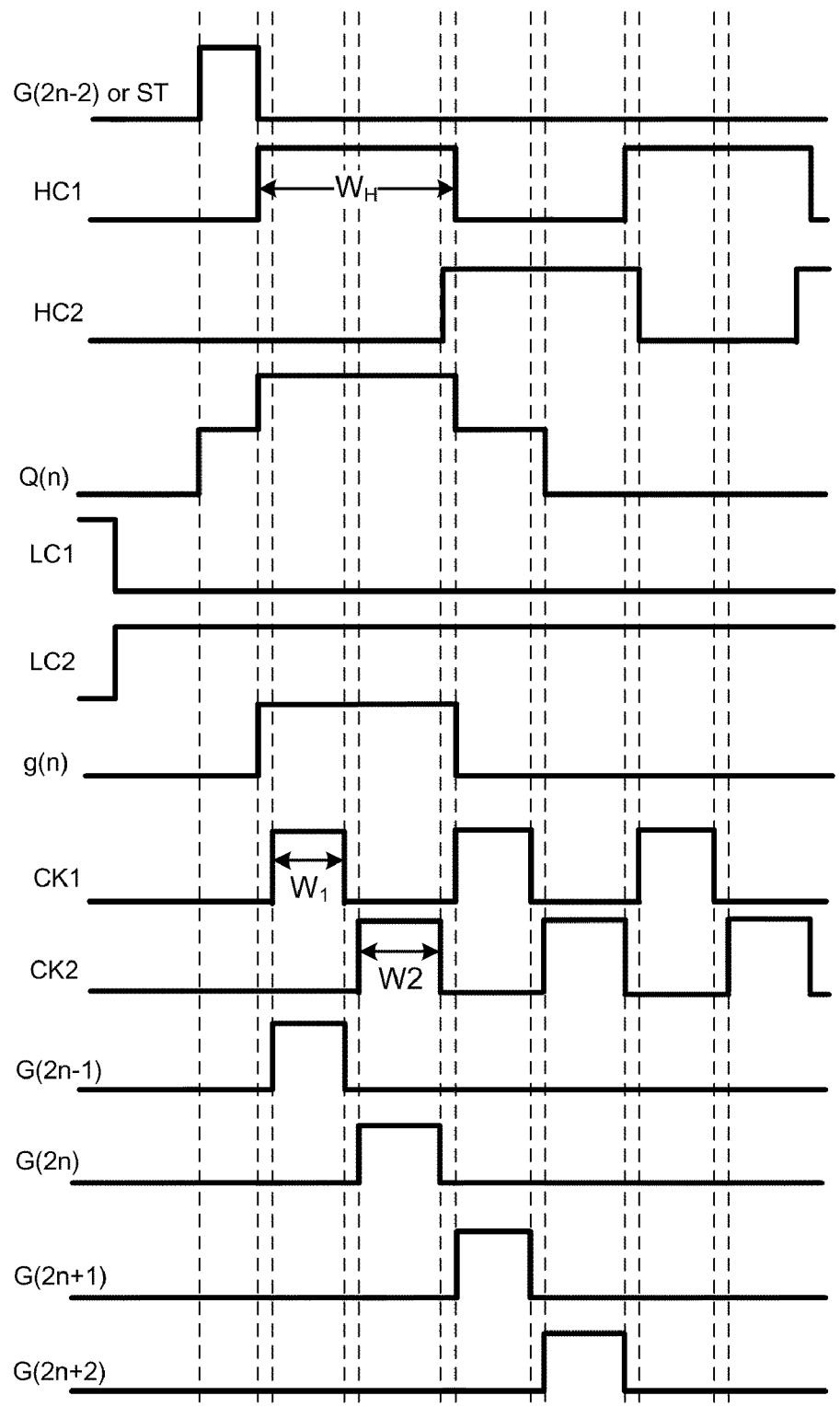
FIG. 9 shows schematically signal time charts of the display panel shown in FIG. 7.

FIG. 9 is time charts of the control signals HC1, HC2, LC2 and LC2, and the clock signals CK1 and CK2 for the shift register shown in FIG. 8, the voltage potential of the node Q(n), the voltage potential of the output g(n), and the corresponding scanning signals G(2n−2), G(2n−1), G(2n), G(2n+1) and G(2n+2) generated by the shift register in response to the control signals and the clock signals. As shown in the time charts, the high voltage pulse widths $W_H$, $W_1$ and $W_2$ of the first control signal HC1, the first and second clock signals CK1 and CK2 obeys the relationship of $W_H \geq (W_1 + W_2)$.

Figure 10:
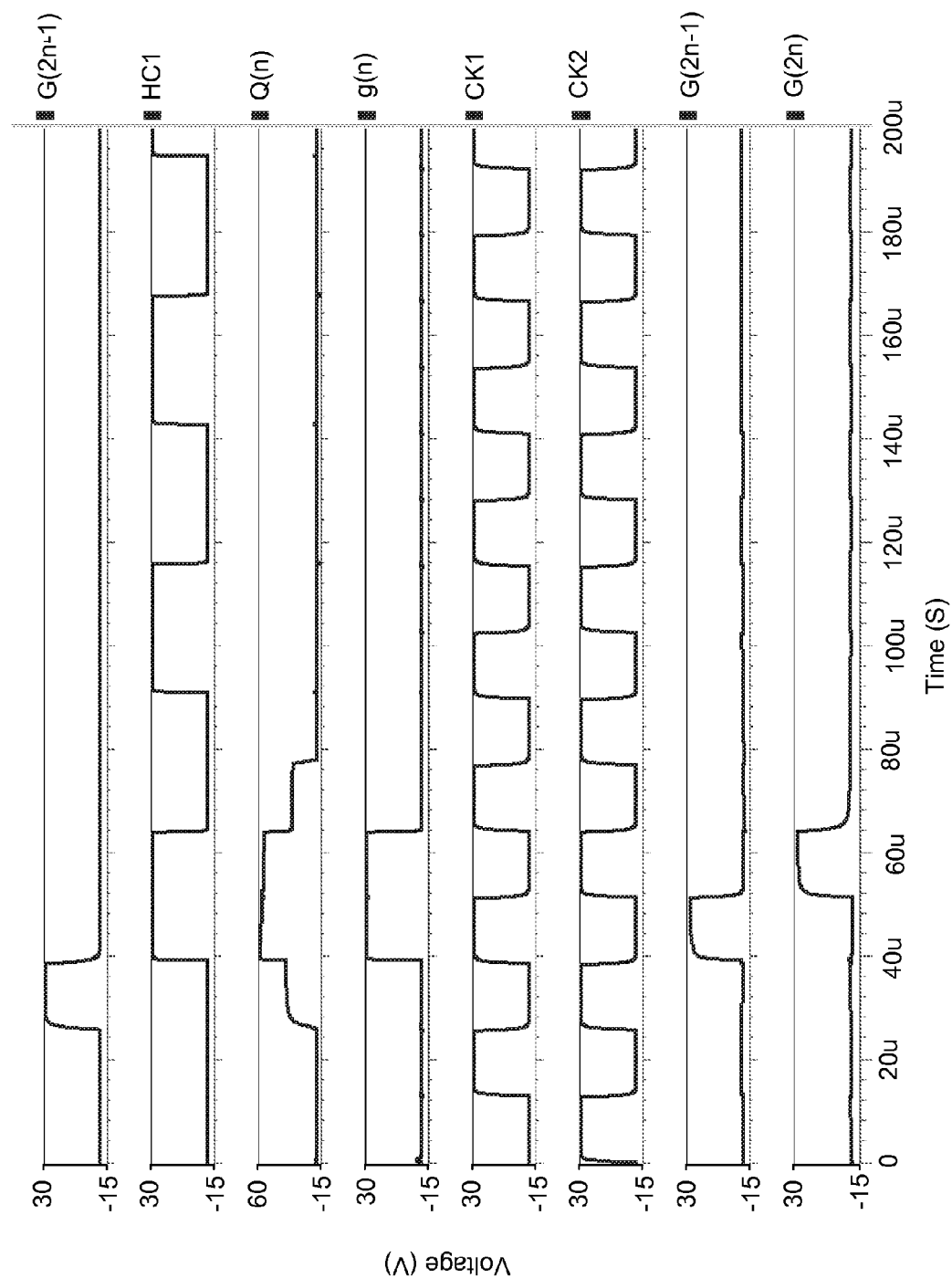
FIG. 10 shows simulated signal time charts of the display panel shown in FIG. 7.

FIG. 10 is a simulated time charts of the control signals HC1, HC2, LC2 and LC2, and the clock signals CK1 and CK2 for the shift register shown in FIG. 8, the voltage potential of the node Q(n), the voltage potential of the output g(n), and the corresponding scanning signals G(2n−2), G(2n−1), G(2n), G(2n+1) and G(2n+2) generated by the shift register in response to the control signals and the clock signals.

Figure 11:
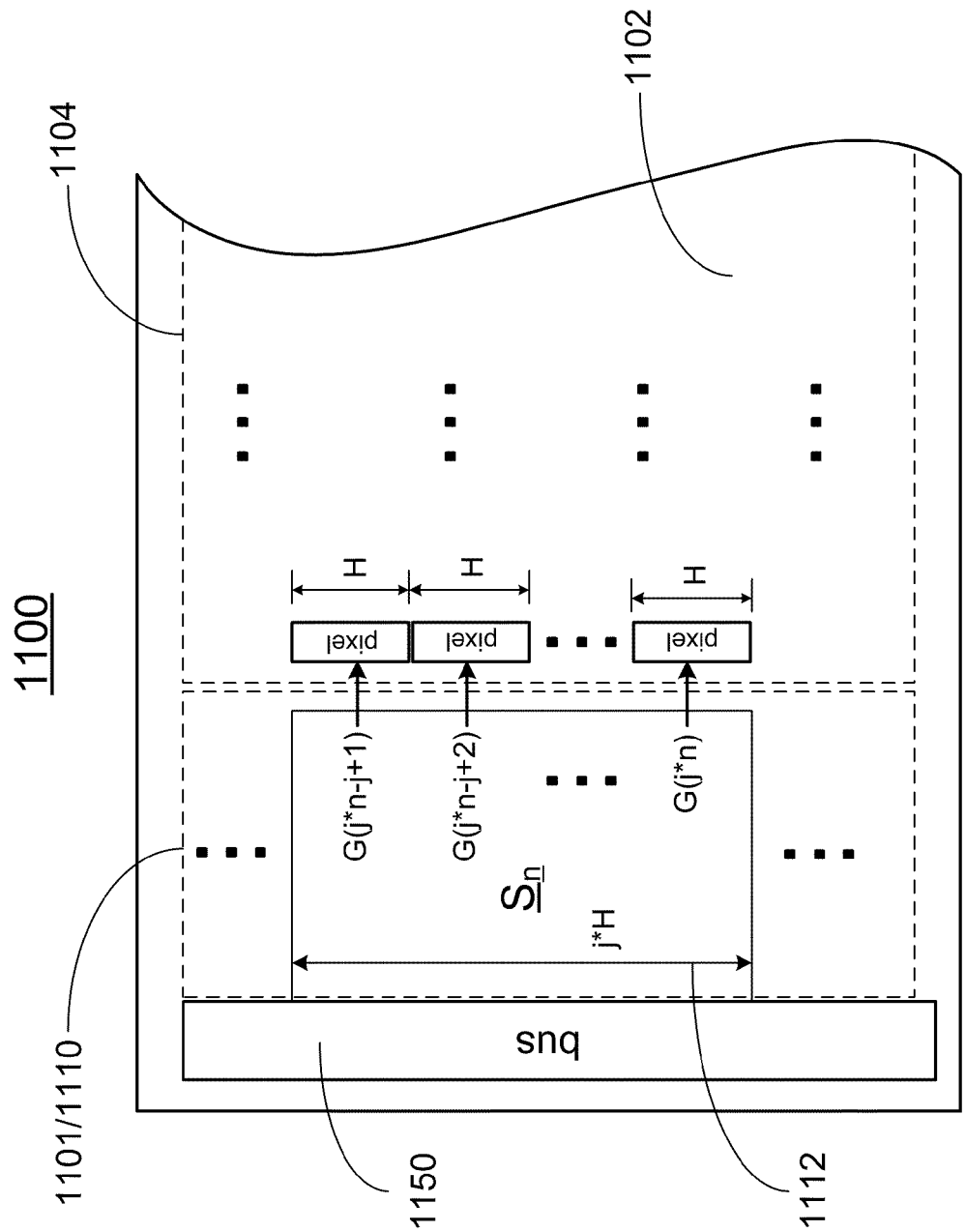
FIG. 11 shows schematically a display panel with a GOA architecture of a shift register formed thereon according to another embodiment of the present invention.
Figure 12:
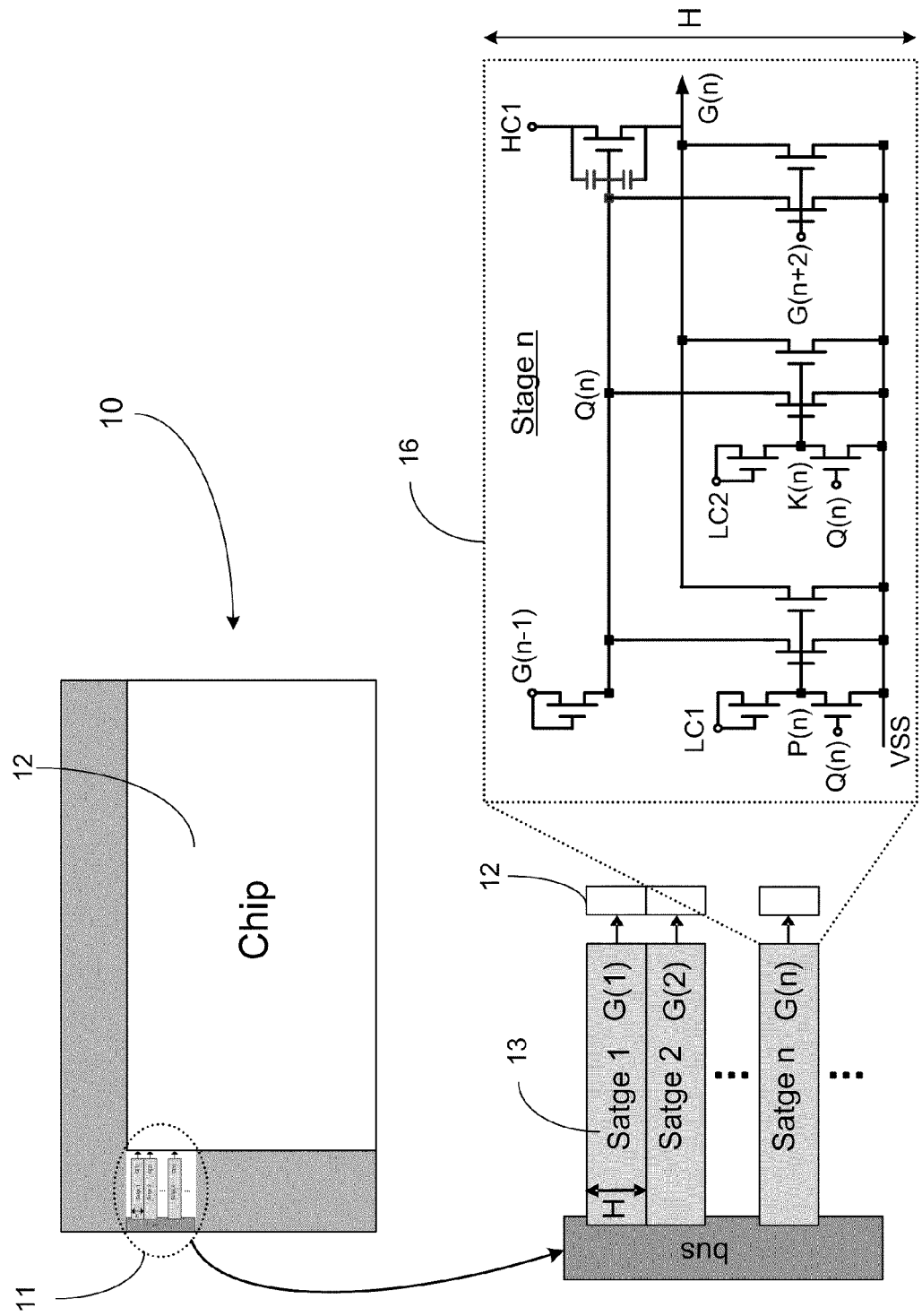
FIG. 12 shows schematically a display panel with a conventional GOA architecture of a shift register formed thereon.

Referring to FIG. 11, a display panel 1100 with a GOA architecture 1101 of a shift register 1110 formed thereon is schematically shown according to another embodiment of the present invention. The display panel 1100 includes a substrate 1102 and a plurality of pixels 1104 spatially formed on the substrate 1102 defining a number of pixel rows. Each pixel row has a height of H.

The shift register 1110 includes a plurality of shift register stages, $\{S_n\}$, n=1, 2, . . . , N, electrically coupled to each other in series. Each shift register stage $S_n$ is configured to receive one or more control and clock signals, for example, a control signal HC1 and the j clock signals, CK1, CK2, . . . and CKj, and to output responsively j scanning signals G(j*n−j+1), G(j*n−j+2), . . . and G(j*n) for driving the (j*n−j+1)-th pixel row, (j*n−j+2)-th pixel row, . . . and the (j*n)-th pixel row of the display panel 1100, respectively.

Each stage $S_n$ includes a stage shift circuit and de-multiplexing circuit (not shown). The stage shift circuit is same as that disclosed above. However, the de-multiplexing circuit has j switch circuits, j being an integer greater than one. The de-multiplexing circuit is adapted for receiving the output signal from the stage shift circuit and j clock signals, CK1, CK2, . . . and CKj from a data bus 1150 and responsively outputting j scanning signals, G(j*n−j+1), G(j*n−j+2), . . . and G(j*n).

Each switch circuit has the same circuit as shown in FIGS. 3-8 and disclosed above. Specifically, each switch circuit has a first input for receiving a corresponding one of the j clock signals, CK1, CK2, . . . and CKj, a second input electrically coupled to the output of the stage shift circuit for receiving the output signal therefrom, and an output for responsively outputting a corresponding one of the j scanning signals, G(j*n−j+1), G(j*n−j+2), . . . and G(j*n).

Practically, the first control signal $HC_n$ is a low frequency AC signal, while all the j clock signals, CK1, CK2, . . . and CKj are high frequency AC signals. Further, each of the first control signal HC1, and the j clock signals, CK1, CK2, . . . and CKj is characterized with a waveform alternating between a high voltage level and a low voltage level, wherein the high voltage levels of the first control signal $HC_n$, and the j clock signals, CK1, CK2, . . . and CKj have widths, $W_H$, $W_1$, $W_2$, . . . and $W_j$, respectively, satisfying the following relationship of:

$$W_H \geq W_1 + W_2 + \ldots + W_j.$$

In this exemplary embodiment, the plurality of shift register stages $\{S_n\}$ is disposed spatially and sequentially on the substrate 1102 in such a way that the layout of each shift register stage $S_n$ has a height of (j*H), and the j scanning signals G(j*n−j+1), G(j*n−j+2), . . . and G(j*n) output from the shift register stage $S_n$ are used to drive the (j*n−j+1)-th pixel row, (j*n−j+2)-th pixel row, . . . and the (j*n)-th pixel row, respectively.

The GOA architecture 1101 also includes a formation of a data bus 1150 on the substrate 1102 for providing, for example, the first control signal $HC_n$, and the j clock signals CK1, CK2, . . . and CKj for each the shift register stage $S_n$.

For such a GOA architecture, the circuit layout of the shift register on the substrate is substantially simplified.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register, comprising a plurality of shift register stages, $\{S_n\}$, n=1, 2, . . . , N, N being a positive integer, electrically coupled to each other in series, each stage $S_n$ comprising:
    (a) a stage shift circuit having a first input for receiving a first control signal, $HC_n$, and an output for outputting an output signal responsively; and
    (b) a de-multiplexing circuit comprising a first switch circuit and a second switch circuit, wherein the first switch circuit has a first input for receiving a first clock signal CK1, a second input electrically coupled to the output of the stage shift circuit, and an output for outputting a first scanning signal, G(2n−1), responsively, and wherein the second switch circuit has a first input for receiving a second clock signal CK2, a second input electrically coupled to the output of the stage shift circuit, and an output for outputting a second scanning signal, G(2n), responsively, wherein each of the first control signal $HC_n$, the first clock signal CK1 and the second clock signal CK2 is characterized with a waveform alternating between a high voltage level and a low voltage level, wherein the high voltage levels of the first control signal $HC_n$, the first clock signal CK1 and the second clock signal CK2 have widths, $W_H$, $W_1$ and $W_2$, respectively, satisfying the following relationship of:

$$W_H \geq W_1 + W_2.$$

2. The shift register of claim 1, wherein each of the first and second switch circuits comprises a first transistor having a gate, a source and a drain electrically coupled to the second input, the first input and the output of the switch circuit, respectively.

3. The shift register of claim 2, wherein each of the first and second switch circuits further comprises a second transistor having a gate electrically coupled to the drain of the first transistor, a source electrically couple to the gate, and a drain electrically coupled to the source of the first transistor.

4. The shift register of claim 2, wherein each of the first and second switch circuits further comprises a pull down circuit electrically coupled to the drain of the first transistor.

5. The shift register of claim 1, wherein each of the first and second switch circuits comprises:
(a) a first transistor having a gate, a source and a drain electrically coupled to the first input, the second input and the output of the switch circuit, respectively; and
(b) a diode having an anode and a cathode electrically coupled to the drain and the gate of the first transistor, respectively.

6. The shift register of claim 1, wherein each of the first and second switch circuits comprises:
(a) a diode having an anode electrically coupled to the first input of the switch circuit and a cathode;
(b) a first transistor having a gate, a source and a drain electrically coupled to the second input of the switch circuit, the cathode of the diode and the output of the switch circuit, respectively; and
(c) a second transistor having a gate electrically coupled to the drain of the first transistor, a source electrically couple to the gate, and a drain electrically coupled to the anode of the diode.

7. The shift register of claim 1, wherein each of the first and second switch circuits comprises:
(a) a diode having an anode electrically coupled to the first input of the switch circuit and a cathode;
(b) a first transistor having a gate, a source and a drain electrically coupled to the second input of the switch circuit, the cathode of the diode and the output of the switch circuit, respectively; and
(c) a pull down circuit electrically coupled to the drain of the first transistor.

8. The shift register of claim 1, wherein the stage shift circuit further has a second input for receiving a second control signal, LC1, a third input for receiving a third control signal, LC2, a fourth input for receiving a reference voltage VSS, a fifth input for receiving the second scanning signal G(2n−2) output from the immediate prior stage, $S_{n-1}$, and a sixth input for receiving the second scanning signal G(2n+2) output from the immediate next stage, $S_{n+1}$.

9. The shift register of claim 8, wherein the stage shift circuit comprises;
(a) a pull-up control circuit electrically coupled to the fifth input;
(b) a pull-up circuit electrically coupled to the pull-up control circuit, the first input and the output;
(c) a pull-down control circuit electrically coupled to the pull-up control circuit, the pull-up circuit, and the second, third and fourth inputs; and
(d) a pull-down circuit electrically coupled to the pull-down control circuit, the pull-up circuit, the sixth input and the output.

10. A gate driver-on-array (GOA) architecture of the shift register of claim 1 in a display panel comprising a substrate and a plurality of pixels spatially formed on the substrate defining a number of pixel rows, each pixel row having a height of H, characterized in that the plurality of shift register stages $\{S_n\}$ is disposed spatially and sequentially on the substrate such that each shift register stage $S_n$ has a layout with a height of 2H, and the first and second scanning signals G(2n−1) and G(2n) output from the shift register stage $S_n$ are used to drive the (2n−1)-th pixel row and the (2n)-th pixel row, respectively.

11. The GOA architecture of claim 10, characterized in that a data bus is disposed on the substrate for providing at least the first control signal $HC_n$, and the first and second clock signal CK1 and CK2.

12. A shift register, comprising a plurality of shift register stages, $\{S_n\}$, n=1, 2, . . . , N, N being a positive integer, electrically coupled to each other in series, each stage $S_n$ comprising:
(a) a stage shift circuit having a first input for receiving a first control signal, $HC_n$, and an output for outputting an output signal responsively; and
(b) a de-multiplexing circuit for receiving the output signal from the stage shift circuit and j clock signals, CK1, CK2, . . . and CKj from a data bus and responsively outputting j scanning signals, G(j*n−j+1), G(j*n−j+2), and G(j*n), comprising j switch circuits, j being an integer greater than one, wherein each switch circuit has a first input for receiving a corresponding one of the j clock signals, CK1, CK2, . . . and CKj, a second input electrically coupled to the output of the stage shift circuit for receiving the output signal therefrom, and an output for outputting a corresponding one of the j scanning signals, G(j*n−j+1), G(j*n−j+2), . . . and G(j*n),
wherein each of the first control signal $HC_n$, and the j clock signals, CK1, CK2, . . . and CKj is characterized with a waveform alternating between a high voltage level and a low voltage level, wherein the high voltage levels of the first control signal $HC_n$, and the j clock signals, CK1, CK2, . . . and CKj have widths, $W_H$, $W_1$, $W_2$, . . . and $W_j$, respectively, satisfying the following relationship of:

$$W_H \geq W_1 + W_2 + \ldots + W_j.$$

13. The shift register of claim 12, wherein each of the j switch circuits comprises a first transistor having a gate, a source and a drain electrically coupled to the second input, the first input and the output of the switch circuit, respectively.

14. The shift register of claim 13 wherein each of the j switch circuits further comprises a second transistor having a gate electrically coupled to the drain of the first transistor, a source electrically couple to the gate, and a drain electrically coupled to the source of the first transistor.

15. The shift register of claim 13, wherein each of the j switch circuits further comprises a pull down circuit electrically coupled to the drain of the first transistor.

16. The shift register of claim 12, wherein each of the j switch circuits comprises:
   (a) a first transistor having a gate, a source and a drain electrically coupled to the first input, the second input and the output of the switch circuit, respectively; and
   (b) a diode having an anode and a cathode electrically coupled to the drain and the gate of the first transistor, respectively.

17. The shift register of claim 12, wherein each of the j switch circuits comprises:
   (a) a diode having an anode electrically coupled to the first input of the switch circuit and a cathode;
   (b) a first transistor having a gate, a source and a drain electrically coupled to the second input of the switch circuit, the cathode of the diode and the output of the switch circuit, respectively; and
   (c) a second transistor having a gate electrically coupled to the drain of the first transistor, a source electrically couple to the gate, and a drain electrically coupled to the anode of the diode.

18. The shift register of claim 12, wherein each of the j switch circuits comprises:
   (a) a diode having an anode electrically coupled to the first input of the switch circuit and a cathode;
   (b) a first transistor having a gate, a source and a drain electrically coupled to the second input of the switch circuit, the cathode of the diode and the output of the switch circuit, respectively; and
   (c) a pull down circuit electrically coupled to the drain of the first transistor.

* * * * *